US 9,985,649 B1

(12) United States Patent
Bassov et al.

(10) Patent No.: US 9,985,649 B1
(45) Date of Patent: May 29, 2018

(54) COMBINING HARDWARE AND SOFTWARE APPROACHES FOR INLINE DATA COMPRESSION

(71) Applicant: EMC Corporation, Hopkinton, MA (US)

(72) Inventors: Ivan Bassov, Brookline, MA (US); Wai C. Yim, Merrimack, NH (US)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days. days.

(21) Appl. No.: 15/197,028

(22) Filed: Jun. 29, 2016

(51) Int. Cl.
*G06F 12/00* (2006.01)
*H03M 7/30* (2006.01)
*G06F 12/128* (2016.01)

(52) U.S. Cl.
CPC ............ *H03M 7/60* (2013.01); *G06F 12/128* (2013.01); *G06F 2212/621* (2013.01)

(58) Field of Classification Search
CPC ............. G06F 11/1471; G06F 12/0804; G06F 12/0866; G06F 13/124; G06F 17/30067; G06F 2212/222; G06F 2212/312
See application file for complete search history.

(56) References Cited

U.S. PATENT DOCUMENTS

| 5,701,516 A | 12/1997 | Cheng et al. |
| 8,190,850 B1 | 5/2012 | Davenport et al. |
| 2007/0074003 A1* | 3/2007 | Yim .................. G06F 9/30058 712/24 |
| 2012/0144146 A1* | 6/2012 | Borkenhagen ........ G06F 3/0608 711/170 |

OTHER PUBLICATIONS

Solution Brief Intel QuickAssist Technology, Accelerating Hadoop Applications Using Intel QuickAssist Technology, pp. 1-4, 2013.
Yannis Klonatos, Transparent Online Storage Compression at the Block-Level Foundation for Research and Technology-Hellas and University of Crete, ACM Transactions on Storage, vol. 8, No. 2, Article 5, Publication Date: May 2012, pp. 1-33.

* cited by examiner

*Primary Examiner* — Yong Choe
(74) *Attorney, Agent, or Firm* — BainwoodHuang

(57) ABSTRACT

A technique for managing data storage applies both inline software compression and inline hardware compression in a data storage system, using both types of compression together. The data storage system applies inline software compression for compressing a first set of newly arriving data and applies inline hardware compression for compressing a second set of newly arriving data. Both sets of data are directed to a data object, and the data storage system compresses both sets of data without first storing uncompressed versions thereof in the data object.

22 Claims, 4 Drawing Sheets

COMBINING HARDWARE AND SOFTWARE APPROACHES FOR INLINE DATA COMPRESSION

BACKGROUND

Data storage systems are arrangements of hardware and software that include one or more storage processors coupled to arrays of non-volatile storage devices, such as magnetic disk drives, electronic flash drives, and/or optical drives, for example. The storage processors service storage requests, arriving from host machines ("hosts"), which specify files or other data elements to be written, read, created, or deleted, for example. Software running on the storage processors manages incoming storage requests and performs various data processing tasks to organize and secure the data elements stored on the non-volatile storage devices.

Some data storage systems employ software compression and decompression to improve storage efficiency. For example, software compression involves loading compression instructions into memory and executing the instructions on stored data using one or more processing cores. A result of such software compression is that compressed data requires less storage space than the original, uncompressed data. Conversely, software decompression involves loading decompression instructions into the memory and executing the instructions on the compressed data using one or more of the processing cores, to restore the compressed data to its original, uncompressed form.

Other data storage systems perform compression and decompression in hardware. For example, a data storage system may include specialized hardware for compressing and decompressing data. The specialized hardware may be provided on the storage processor itself, e.g., as a chip, chipset, or sub-assembly, or on a separate circuit board assembly. Unlike software compression, which operates by running executable software instructions on a computer, hardware compression employs one or more ASICs (Application Specific Integrated Circuits), FPGAs (Field Programmable Gate Arrays), RISC (Reduced Instruction Set Computing) processors, and/or other specialized devices in which operations may be hard-coded and performed at high speed.

SUMMARY

Data storage systems that employ compression generally do so in the background, such as by running a background process or daemon that acts upon already-stored data. However, performing background compression may result in an over-commitment of storage resources, as more storage space than necessary may be required to accommodate initial writes. Also, background compression may entail reading previously-written data from persistent storage and rewriting compressed data back to persistent storage, resulting in a significant increase in disk traffic.

In addition, known data storage systems that employ compression have used only software compression or only hardware compression, but not both. Unfortunately, software compression, although it is not generally costly to implement, can place a large burden on computing resources, which may become so great as to displace resources needed to service host IO (Input/Output) requests, thus negatively impacting data storage system performance. Hardware compression is generally faster than software compression and does not displace computing resources. However, hardware compression consumes physical resources, such as space, power, and cooling, and can be expensive.

In contrast with the above-described prior approaches, an improved technique applies both inline software compression and inline hardware compression in a data storage system, using both types of compression together. The data storage system applies inline software compression for compressing a first set of newly arriving data and applies inline hardware compression for compressing a second set of newly arriving data. Both sets of data are directed to a data object, and the data storage system compresses both sets of data without first storing uncompressed versions thereof in the data object.

By performing compression inline, rather than in the background, embodiments of the improved technique avoid the over-commitment of storage resources and the high disk traffic associated with background compression. Also, by providing software compression and hardware compression together, a data storage system may benefit from the strengths of both. For example, the data storage system can perform more software compression when it is not otherwise busy servicing hosts, but can perform more hardware compression during busier times. Also, hardware compression runs faster than software compression and may thus help to keep pace with demands for inline compression during times of heavy write activity. In some examples, data that was compressed using hardware may be decompressed using software. For example, if data compressed using hardware is migrated to a data storage system that does not support hardware decompression, the data may still be decompressed using software decompression. Likewise, in some examples, data compressed using software may be decompressed using hardware.

Certain embodiments are directed to a method of managing data storage. The method includes receiving multiple requests to write data to a data object stored in a data storage system, the data storage system including a set of processing units and memory. The method further includes performing a first inline compression of a first set of the data using software compression. The software compression is carried out by executing a set of instructions stored in the memory by the set of processing units. The first inline compression produces a first set of compressed data and is performed without storing the first set of data in the data object prior to compression. The method further includes performing a second inline compression of a second set of the data using hardware compression. The hardware compression is carried out by compression hardware running in the data storage system. The second inline compression produces a second set of compressed data and is performed without storing the second set of data in the data object prior to compression. The method still further includes storing the first set of compressed data in the data object and storing the second set of compressed data in the data object.

Other embodiments are directed to a data storage system constructed and arranged to perform a method of managing data storage, such as the method described above. Still other embodiments are directed to a computer program product. The computer program product stores instructions which, when executed on control circuitry of a data storage system, cause the data storage system to perform a method of managing data storage, such as the method described above. Some embodiments involve activity that is performed at a single location, while other embodiments involve activity that is distributed over a computerized environment (e.g., over a network).

It should be understood that this summary is provided to familiarize the reader with features of disclosed embodiments and is not intended to define the invention hereof or to be limiting in any way.

BRIEF DESCRIPTION OF THE SEVERAL VIEWS OF THE DRAWINGS

The foregoing and other features and advantages will be apparent from the following description of particular embodiments of the invention, as illustrated in the accompanying drawings, in which like reference characters refer to the same or similar parts throughout the different views. In the accompanying drawings.

DETAILED DESCRIPTION OF THE INVENTION

Embodiments of the invention will now be described. It is understood that such embodiments are provided by way of example to illustrate various features and principles of the invention, and that the invention hereof is broader than the specific example embodiments disclosed.

An improved technique for managing data storage in a data storage system applies both inline software compression and inline hardware compression, using both types of compression together for compressing newly-arriving data.

Figure 1:
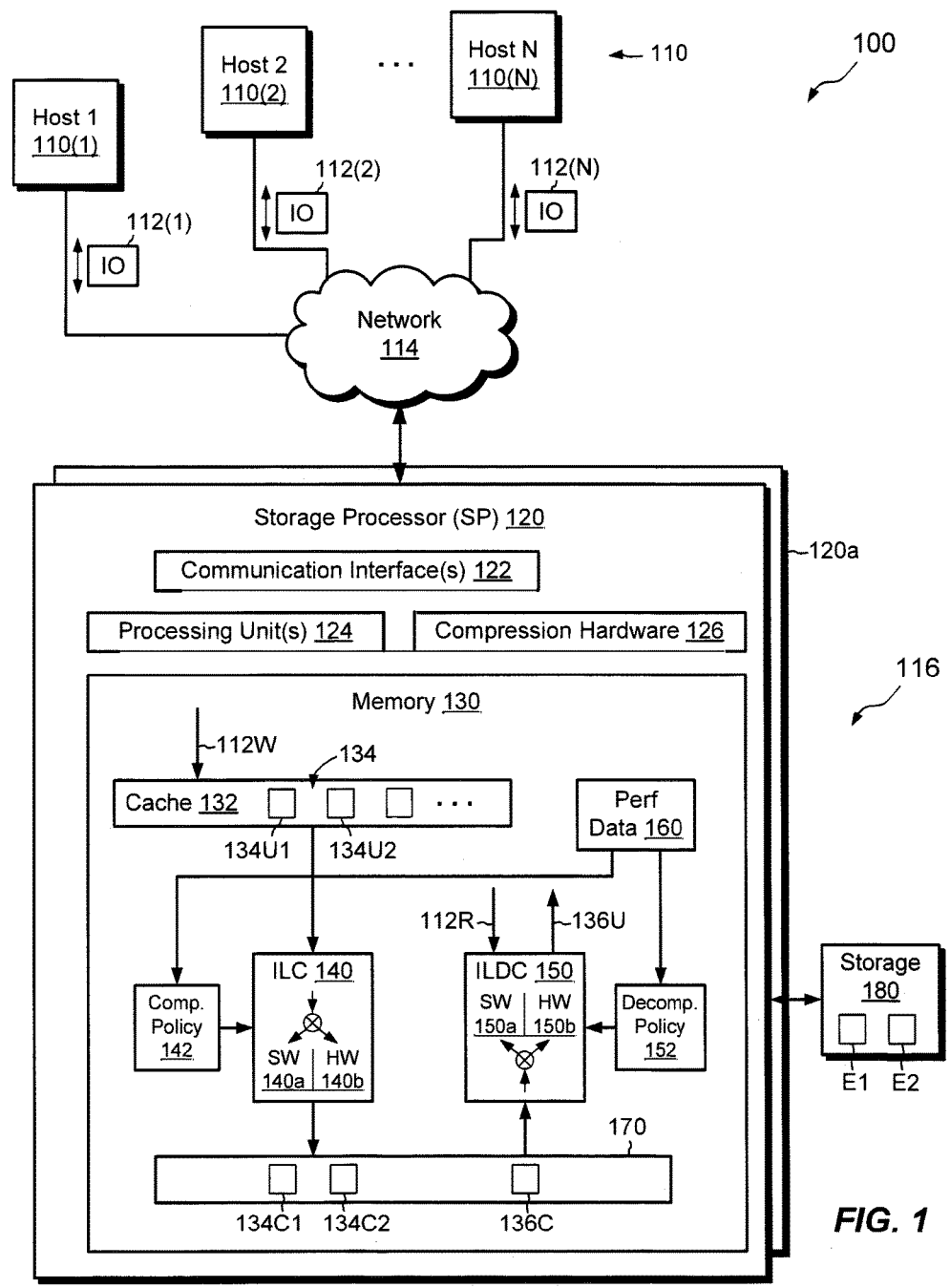
FIG. 1 is a block diagram of an example environment in which improved techniques hereof for managing data storage can be practiced.

FIG. 1 shows an example environment 100 in which embodiments of the improved technique hereof can be practiced. Here, multiple host computing devices ("hosts") 110, shown as devices 110(1) through 110(N), access a data storage system 116 over a network 114. The data storage system 116 includes a storage processor, or "SP," 120 and storage 180. In an example, the storage 180 includes multiple disk drives, such as magnetic disk drives, electronic flash drives, optical drives, and/or other types of drives. Such disk drives may be arranged in RAID (Redundant Array of Independent/Inexpensive Disks) groups, for example, or in any other suitable way.

In an example, the data storage system 116 includes multiple SPs, like the SP 120 (e.g., a second SP, 120*a*). The SPs may be provided as circuit board assemblies, or "blades," which plug into a chassis that encloses and cools the SPs. The chassis may have a backplane for interconnecting the SPs, and additional connections may be made among SPs using cables. No particular hardware configuration is required, however, as any number of SPs, including a single SP, may be provided and the SP 120 can be any type of computing device capable of processing host IOs.

The network 114 may be any type of network or combination of networks, such as a storage area network (SAN), a local area network (LAN), a wide area network (WAN), the Internet, and/or some other type of network or combination of networks, for example. The hosts 110(1-N) may connect to the SP 120 using various technologies, such as Fibre Channel, iSCSI, NFS, SMB 3.0, and CIFS, for example. Any number of hosts 110(1-N) may be provided, using any of the above protocols, some subset thereof, or other protocols besides those shown. As is known, Fibre Channel and iSCSI are block-based protocols, whereas NFS, SMB 3.0, and CIFS are file-based protocols. The SP 120 is configured to receive IO (input/output) requests 112(1-N) according to block-based and/or file-based protocols and to respond to such IO requests 112(1-N) by reading and/or writing the storage 180.

As further shown in FIG. 1, the SP 120 includes one or more communication interfaces 122, a set of processing units 124, compression hardware 126, and memory 130. The communication interfaces 122 may be provided, for example, as SCSI target adapters and/or network interface adapters for converting electronic and/or optical signals received over the network 114 to electronic form for use by the SP 120. The set of processing units 124 includes one or more processing chips and/or assemblies. In a particular example, the set of processing units 124 includes numerous multi-core CPUs.

The compression hardware 126 includes dedicated hardware, e.g., one or more integrated circuits, chipsets, subassemblies, and the like, for performing data compression and decompression in hardware. The hardware is "dedicated" in that it does not perform general-purpose computing but rather is focused on compression and decompression of data. In some examples, compression hardware 126 takes the form of a separate circuit board, which may be provided as a daughterboard on SP 120 or as an independent assembly that connects to the SP 120 over a backplane, midplane, or set of cables, for example. A non-limiting example of compression hardware 126 includes the Intel® QuickAssist Adapter, which is available from Intel Corporation of Santa Clara, Calif.

The memory 130 includes both volatile memory (e.g., RAM), and non-volatile memory, such as one or more ROMs, disk drives, solid state drives, and the like. The set of processing units 124 and the memory 130 together form control circuitry, which is constructed and arranged to carry out various methods and functions as described herein. Also, the memory 130 includes a variety of software constructs realized in the form of executable instructions. When the executable instructions are run by the set of processing units 124, the set of processing units 124 are caused to carry out the operations of the software constructs. Although certain software constructs are specifically shown and described, it is understood that the memory 130 typically includes many other software constructs, which are not shown, such as an operating system, various applications, processes, and daemons.

As further shown in FIG. 1, the memory 130 "includes," i.e., realizes by execution of software instructions, a cache 132, an inline compression (ILC) engine 140, an inline decompression (ILDC) engine 150, and a data object 170. A compression policy 142 provides control input to the ILC engine 140, and a decompression policy 152 provides control input to the ILDC engine 150. Both the compression policy 142 and the decompression policy 152 receive performance data 160, which describe a set of operating conditions in the data storage system 116.

In an example, the data object 170 is a host-accessible data object, such as a LUN (Logical UNit), a file system, or a virtual machine disk (e.g., a VVol, available from VMWare, Inc. of Palo Alto, Calif.). The SP 120 exposes the data object 170 to hosts 110 for reading, writing, and/or other data operations. In one particular, non-limiting example, the SP 120 runs an internal file system and implements data object 170 within a single file of that file system. In such an example, the SP 120 includes mapping (not shown) to convert read and write requests from hosts 110 (e.g., IO requests 112(1-N)) to corresponding reads and writes to the file in the internal file system.

As further shown in FIG. 1, ILC engine 140 includes a software component (SW) 140a and a hardware component (HW) 140b. The software component 140a includes a compression method, such as an algorithm, which may be implemented using software instructions. Such instructions may be loaded in memory and executed by processing units 124, or some subset thereof, for compressing data directly, i.e., without involvement of the compression hardware 126. In comparison, the hardware component 140b includes software constructs, such as a driver and API (application programmer interface) for communicating with compression hardware 126, e.g., for directing data to be compressed by the compression hardware 126. In some examples, either or both components 140a and 140b supports multiple compression algorithms. The compression policy 142 and/or a user may select a compression algorithm best suited for current operating conditions, e.g., by selecting an algorithm that produces a high compression ratio for some data, by selecting an algorithm that executes at high speed for other data, and so forth.

For decompressing data, the ILDC engine 150 includes a software component (SW) 150a and a hardware component (HW) 150b. The software component 150a includes a decompression algorithm implemented using software instructions, which may be loaded in memory and executed by any of processing units 124 for decompressing data in software, without involvement of the compression hardware 126. The hardware component 150b includes software constructs, such as a driver and API for communicating with compression hardware 126, e.g., for directing data to be decompressed by the compression hardware 126. Either or both components 150a and 150b may support multiple decompression algorithms. In some examples, the ILC engine 140 and the ILDC engine 150 are provided together in a single set of software objects, rather than as separate objects, as shown.

In example operation, hosts 110(1-N) issue IO requests 112(1-N) to the data storage system 116 to perform reads and writes of data object 170. SP 120 receives the IO requests 112(1-N) at communications interface(s) 122 and passes them to memory 130 for further processing. Some IO requests 112(1-N) specify data writes 112W, and others specify data reads 112R. Cache 132 receives write requests 112W and stores data specified thereby in cache elements 134. In a non-limiting example, the cache 132 is arranged as a circular data log, with data elements 134 that are specified in newly-arriving write requests 112W added to a head and with further processing steps pulling data elements 134 from a tail. In an example, the cache 132 is implemented in DRAM (Dynamic Random Access Memory), the contents of which are mirrored between SPs 120 and 120a and persisted using batteries. In an example, SP 120 may acknowledge writes 112W back to originating hosts 110 once the data specified in those writes 112W are stored in the cache 132 and mirrored to a similar cache on SP 120a. It should be appreciated that the data storage system 116 may host multiple data objects, i.e., not only the data object 170, and that the cache 132 may be shared across those data objects.

When the SP 120 is performing writes, the ILC engine 140 selects between the software component 140a and the hardware component 140b based on input from the compression policy 142. For example, the ILC engine 140 is configured to steer incoming write requests 112W either to the software component 140a for performing software compression or to the hardware component 140b for performing hardware compression.

In an example, cache 132 flushes to the respective data objects, e.g., on a periodic basis. For example, cache 132 may flush element 134U1 to data object 170 via ILC engine 140. In accordance with compression policy 142, ILC engine 140 selectively directs data in element 134U1 to software component 140a or to hardware component 140b. In this example, compression policy 142 selects software component 140a. As a result, software component 140a receives the data of element 134U1 and applies a software compression algorithm to compress the data. The software compression algorithm resides in the memory 130 and is executed on the data of element 134U1 by one or more of the processing units 124. Software component 140a then directs the SP 120 to store the resulting compressed data 134C1 (the compressed version of the data in element 134U1) in the data object 170. Storing the compressed data 134C1 in data object 170 may involve both storing the data itself and storing any metadata structures required to support the data 134C1, such as block pointers, a compression header, and other metadata.

It should be appreciated that this act of storing data 134C1 in data object 170 provides the first storage of such data in the data object 170. For example, there was no previous storage of the data of element 134U1 in the data object 170. Rather, the compression of data in element 134U1 proceeds "inline" because it is conducted in the course of processing the first write of the data to the data object 170.

Continuing to another write operation, cache 132 may proceed to flush element 134U2 to data object 170 via ILC engine 140, which, in this case, directs data compression to hardware component 140b, again in accordance with policy 142. As a result, hardware component 140b directs the data in element 134U2 to compression hardware 126, which obtains the data and performs a high-speed hardware compression on the data. Hardware component 140b then directs the SP 120 to store the resulting compressed data 134C2 (the compressed version of the data in element 134U2) in the data object 170. Compression of data in element 134U2 also takes place inline, rather than in the background, as there is no previous storage of data of element 134U2 in the data object 170.

In an example, directing the ILC engine 140 to perform hardware or software compression further entails specifying a particular compression algorithm. The algorithm to be used in each case is based on compression policy 142 and/or specified by a user of the data storage system 116. Further, it should be appreciated that compression policy 142 may operate ILC engine 140 in a pass-through mode, i.e., one in which no compression is performed. Thus, in some examples, compression may be avoided altogether if the SP 120 is too busy to use either hardware or software compression.

In some examples, storage 180 is provided in the form of multiple extents, with two extents E1 and E2 particularly shown. In an example, the data storage system 116 monitors a "data temperature" of each extent, i.e., a frequency of read and/or write operations performed on each extent, and selects compression algorithms based on the data temperature of extents to which writes are directed. For example, if extent E1 is "hot," meaning that it has a high data temperature, and the data storage system 116 receives a write directed to E1, then compression policy 142 may select a compression algorithm that executes at high speed for compressing the data directed to E1. However, if extent E2 is "cold," meaning that it has a low data temperature, and the data storage system 116 receives a write directed to E2, then compression policy 142 may select a compression algorithm that executes at high compression ratio for compressing data directed to E2.

When SP 120 performs reads, the ILDC engine 150 selects between the software component 150a and the hardware component 150b based on input from the decompression policy 152 and also based on compatible algorithms. For example, if data was compressed using a particular software algorithm for which no corresponding decompression algorithm is available in hardware, the ILDC engine 150 may steer the compressed data to the software component 150a, as that is the only component equipped with the algorithm needed for decompressing the data. However, if both components 150a and 150b provide the necessary algorithm, then selection among components 150a and 150b may be based on decompression policy 152.

To process a read request 112R directed to compressed data 136C, the ILDC engine 150 accesses metadata of the data object 170 to obtain a header for the compressed data 136C. The compression header specifies the particular algorithm that was used to compress the data 136C. The ILDC engine 150 may then check whether the algorithm is available to software component 150a, to hardware component 150b, or to both. If the algorithm is available only to one or the other of components 150a and 150b, the ILDC engine 150 directs the compressed data 136C to the component that has the necessary algorithm. However, if the algorithm is available to both components 150a and 150b, the ILDC engine 150 may select between components 150a and 150b based on input from the decompression policy 152. If the software component 150a is selected, the software component 150a performs the decompression, i.e., by executing software instructions on one or more of the set of processors 124. If the hardware component 150b is selected, the hardware component 150b directs the compression hardware 126 to decompress the data 136C. The SP 120 then returns the resulting uncompressed data 136U to the requesting host 110.

It should be appreciated that the ILDC engine 150 is not required to use software component 150a to decompress data that was compressed by the software component 140a of the ILC engine 140. Nor is it required that the ILDC engine 150 use hardware component 150b to decompress data that was compressed by the hardware component 140b. Rather, the component 150a or 150b may be selected flexibly as long as algorithms are compatible. Such flexibility may be especially useful in cases of data migration. For example, consider a case where data object 170 is migrated to a second data storage system (not shown). If the second data storage system does not include compression hardware 126, then any data compressed using hardware on data storage system 116 may be decompressed on the second data storage system using software.

With the arrangement of FIG. 1, the SP 120 intelligently directs compression and decompression tasks to software or to hardware based on operating conditions in the data storage system 116. For example, if the set of processing units 124 are already busy but the compression hardware 126 is not, the compression policy 142 can direct more compression tasks to hardware component 140b. Conversely, if compression hardware 126 is busy but the set of processing units 124 are not, the compression policy 142 can direct more compression tasks to software component 140a. Decompression policy 152 may likewise direct decompression tasks based on operating conditions, at least to the extent that direction to hardware or software is not already dictated by the algorithm used for compression. In this manner, the data storage system 116 is able to perform inline compression using both hardware and software techniques, leveraging the capabilities of both while applying them in proportions that result in best overall performance.

Figure 2:
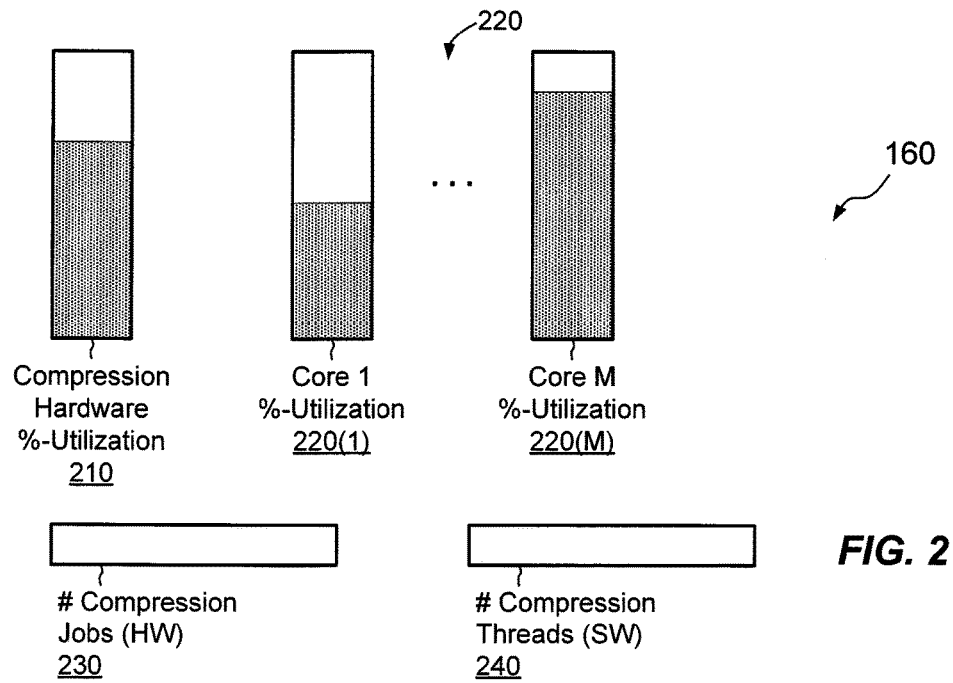
FIG. 2 is a block diagram of example measures of performance data that indicate an example set of operating conditions in the environment of FIG. 1.

FIG. 2 shows example sources of performance data 160, which indicate an operating condition of the data storage system 116. For example, performance data 160 may include percent-utilization 210 of compression hardware 126. Such percent-utilization 210 may range from 0% (inactive) to 100% (active and fully saturated). The performance data 160 may further includes measures of percent-utilization 220(1) to 220(M), i.e., one for each of M processor cores in the set of processing units 124. In addition, SP 120 may maintain counters 230 and 240. Counter 230 maintains a count of active compression jobs (e.g., tasks or threads) running on compression hardware 126, and counter 240 maintains a count of active compression threads running in software, i.e., being executed by the set of processing units 124. Each time a new compression job or thread is started, the SP 120 increments the corresponding counter 230 or 240. Likewise, each time a compression job or thread finishes, the SP 120 decrements the corresponding counter 230 or 240. The particular sources of performance data 160 shown in FIG. 2 are intended to be illustrative rather than exhaustive. For example, additional counters may be provided for numbers of decompression jobs and/or threads, numbers of compression jobs or threads pending (e.g., waiting in line for processing), and so forth.

Figure 3:
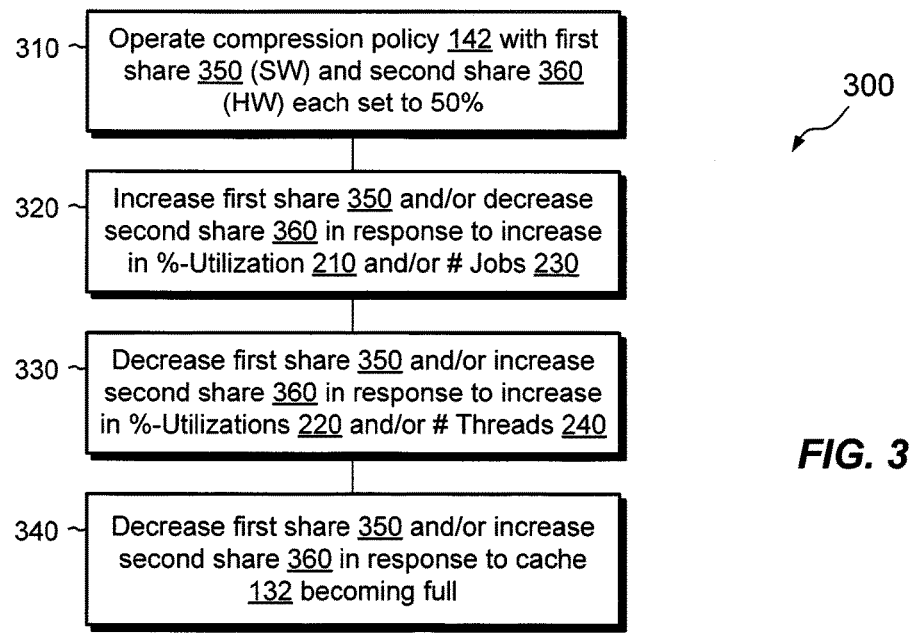
FIG. 3 is a flowchart showing an example method of implementing a compression policy in the environment of FIG. 1.

FIG. 3 shows an example method 300 for directing compression tasks to hardware component 140a and to software component 140b in the arrangement of FIG. 1. The method 300 may be carried out, for example, by the compression policy 142 running on SP 120 to direct operations of the ILC engine 140. The order of operations in method 300 may be varied, with the order shown being merely illustrative. Acts may be performed in orders different from that shown, some acts may be repeated multiple times, and other acts need not be performed at all.

At 310, the compression policy 142 is configured to direct a first share 350 of newly arriving data writes to software compression and to direct a second share 360 of newly arriving data writes to hardware compression. In an example, the first and second shares are predetermined. For instance, each may be set to 50%, such that the software component 140a and the hardware component 140b each perform compression for approximately half of incoming write requests 112W. Shares may initially be apportioned differently, however, such as 60-40, 30-70, or in any other proportion, based on expected initial conditions. Various mechanisms may be used to implement apportionment of shares 350 and 360 to software and hardware components. For example, the ILC engine 140 may alternate components 140a and 140b for every other write. ILC engine 140 may also maintain counters for writes sent to each, read those counters regularly, and direct compression so as to equalize their values over time (for 50-50 division), or to steer their values toward some other distribution, if desired.

At 320, the compression policy 142 detects in increase in activity of the compression hardware 126, e.g., as indicated by an increase in percent-utilization 210 and/or by an increase in the number of compression jobs 230. In response to such detection, the compression policy 142 increases the first share 350 of newly arriving writes directed to software component 140a and/or decreases the second share 360 of newly arriving writes directed to hardware component 140b. A result of act 320 is thus to divert compression tasks more to software when hardware compression becomes busier.

At 330, the compression policy 142 detects in increase in compression activity among processor cores in the set of processing units 124, e.g., based on an increase in any of percent utilizations 220 and/or based on an increase in the count of threads 230. In response to such detection, the compression policy 142 decreases the first share 350 of newly arriving writes directed to software component 140a and/or increases the second share 360 of newly arriving writes directed to hardware component 140b. A result of act 330 is thus to divert compression tasks more to hardware when software compression becomes busier or when the cores of processing units 124 are otherwise occupied.

At 340, the compression policy 142 detects that the cache 132 (FIG. 1) is becoming full. For example, cache 132 may have a high-water mark which, if exceeded, generates performance data 160 to which the compression policy 142 may respond. In response to the cache 132 becoming full, the compression policy 142 may decrease the first share 350 and/or increase the second share 360, thereby diverting more compression tasks to faster compression that uses hardware. If even hardware compression cannot keep pace with incoming writes, the compression policy 142 may direct the ILC engine 140 temporarily to stop performing compression, until free space in the cache 132 can be created.

Figure 4:
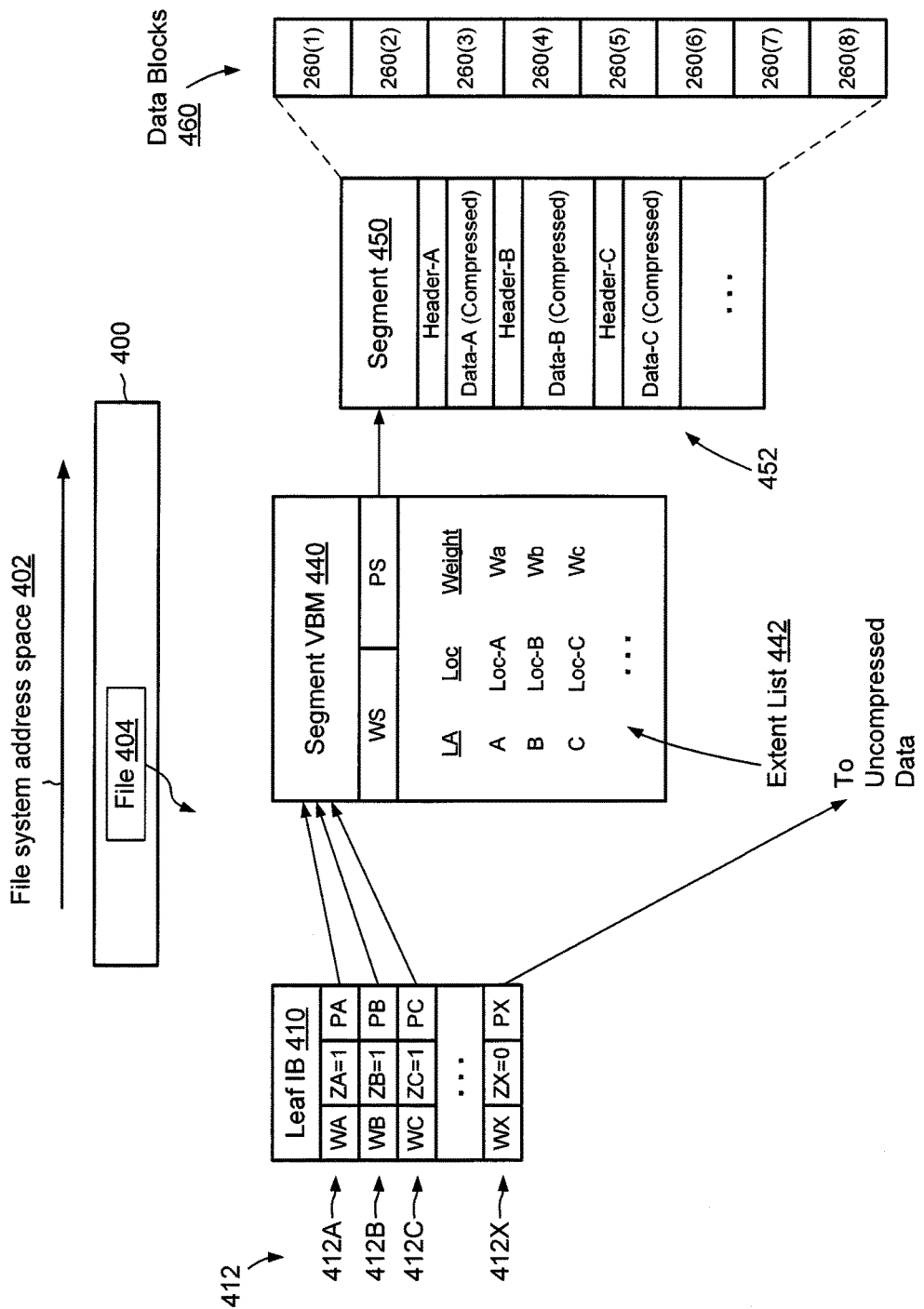
FIG. 4 is a block diagram of example metadata structures involved in storing compressed data in the environment of FIG. 1.

FIG. 4 shows example metadata structures involved in performing inline compression. For purposes of illustration, data object 170 is assumed to be implemented in a file 404 that resides within an internal file system 400 in the data storage system 116. However, embodiments are not limited to this particular approach.

The file 404 that implements data object 170 is seen to have a leaf IB (Indirect Block) 410, which includes block pointers 412 that map logical addresses of the file to corresponding physical addresses in the file system. For example, block pointer 412A maps logical address A, block pointer 412B maps logical address B, block pointer 412C maps logical address C, and block pointer 412X maps logical address X. Although only four block pointers 412(1-3 and X) are specifically shown, it should be appreciated that the leaf IB 410 may include any number of block pointers 412. In a common arrangement, the leaf IB includes 1024 block pointers, for example. Although a single leaf IB 210 is shown, the file implementing data object 270 may have many leaf IBs, which may be arranged in an IB tree for mapping a large logical address range of the file 404 to corresponding physical addresses in the file system 400. A "physical address" is a unique address within a physical address space 402 of the file system 400.

Each block pointer 412 include a weight (WA, WB, WC, . . . , WX), a Z-bit (ZA, ZB, ZC, . . . ZX) and a pointer (PA, PB, PC, . . . , PX). The weight in each block pointer 412 indicates the number of other block pointers in the file system 400 that point to that block pointer. The Z-bit indicates whether the pointed-to data is compressed, and the pointer provides a physical address to be inspected for locating the pointed-to data. The block at the indicated physical address may contain the pointed-to data itself (e.g., for uncompressed data) or it may provide a segment VBM (virtual block map) 440 (e.g., for compressed data). The segment VBM 440 points to a segment 450, which stores compressed data. In an example, segment 450 is composed of data blocks 460 (i.e., blocks 460(1) through 460(8)), which have contiguous physical addresses in the file system 400). As is known, a "block" is a unit of storage that may be allocated in a file system. Typical block sizes are 4 KB, 8 KB, for example. For purposes of storing compressed data, boundaries between blocks 460(1) through 460(8) are ignored and the segment 450 is treated as one contiguous space.

The segment VBM 440 itself has a weight WS and a pointer PS. The weight WS indicates the number of block pointers (e.g., 412) that point to the segment VBM 440, and the pointer PS points to the physical address of the segment 450, which by convention may be selected to be the address of the first data block 460 (e.g., that of block 260(1)). The segment VBM 440 also includes an extent list 442. Extent list 442 describes the contents of segment 450 and relates, for each item of compressed data, the logical address of that item in the file (e.g., A, B, and C), the location (e.g., byte offset) of that data in the segment 450 (e.g., Loc-A, Loc-B, and Loc-C), and a weight (Wa, Wb, and Wc). In an example, the sum of weights of extents in the extent list 442 equals the total weight WS of the segment VBM 440.

The detail shown in segment 450 indicates an example layout 452 of data items. For instance, Header-A can be found at Loc-A and is immediately followed by compressed Data-A. Likewise, Header-B can be found at Loc-B and is immediately followed by compressed Data-B. Similarly, Header-C can be found at Loc-C and is immediately followed by compressed Data-C.

In an example, each compression header is a fixed-size data structure that includes fields for specifying compression parameters, such as compression algorithm, length, CRC (cyclic redundancy check), and flags. In some examples, the header specifies whether the compression was performed in hardware or in software.

For performing writes, the ILC engine 140 generates each compression header (Header-A, Header-B, Header-C, etc.) when performing compression on data elements 134, and directs the file system 400 to store the compression header together with the compressed data. The ILC engine 140 generates different headers for different data, with each header specifying a respective compression algorithm. For performing data reads, the file system 400 looks up the compressed data, e.g., by following a pointer 412 in the leaf IB 410 to the segment VBM 440, which specifies a location within the segment 450. The file system 400 reads the header at the specified location, identifies the compression algorithm that was used to compress the data, and then directs the ILDC 150 to decompress the compressed data using the specified algorithm.

Figure 5:
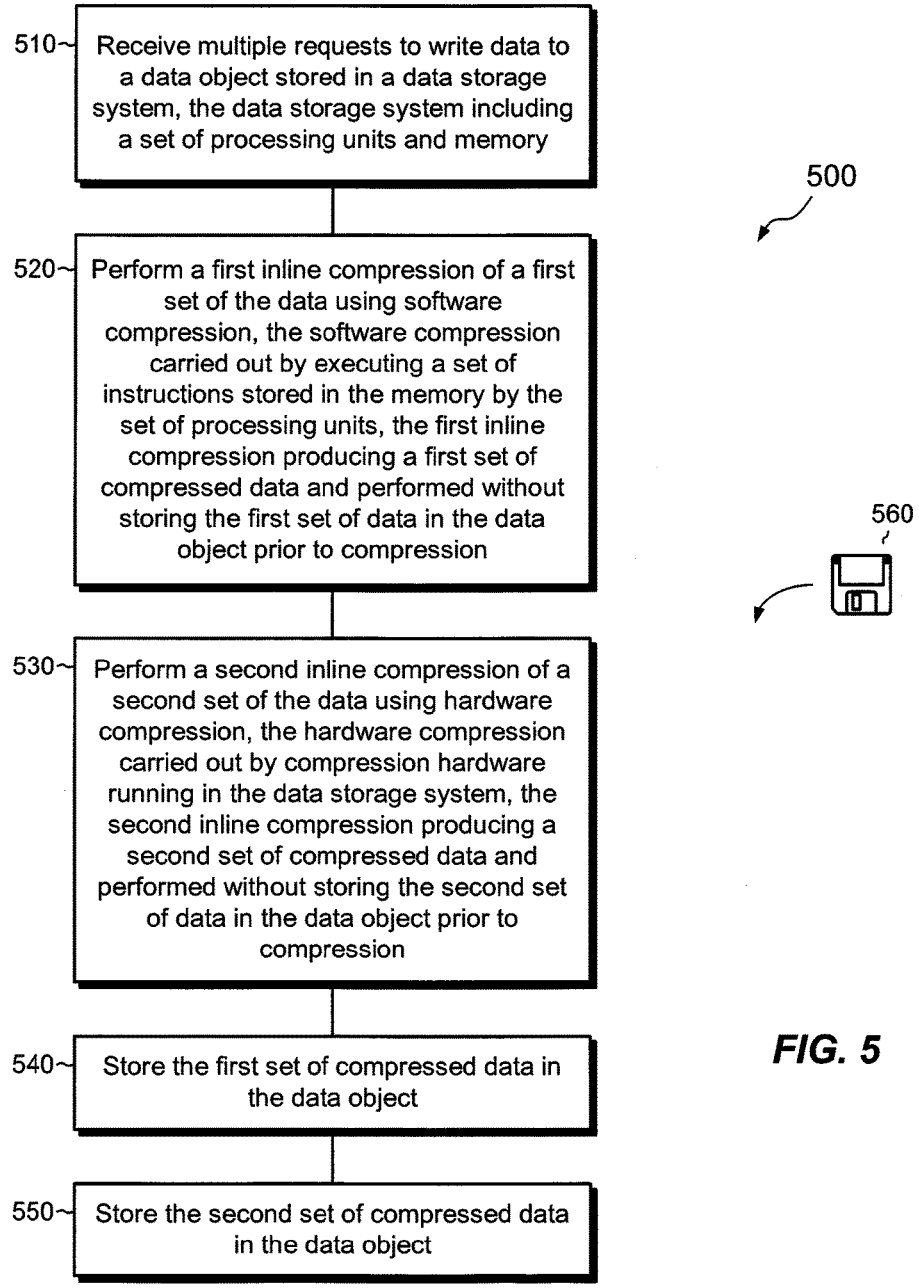
FIG. 5 is a flowchart showing an example method of managing data storage.

FIG. 5 shows an example method 500 for managing data storage. The method 500 may be carried out by the software constructs described in connection with FIG. 1, which are operated on SP 120. Also, the various acts of the method 500 may be ordered in any suitable way. Accordingly, embodiments may be constructed in which acts are performed in orders different from that illustrated, which may include performing some acts simultaneously.

At 510, multiple requests 112W are received to write data to a data object 170 stored in a data storage system 116, which includes a set of processing units 124 and memory 130.

At 520, a first inline compression is performed of a first set of the data 134U1 using software compression (via component 140a). The software compression is carried out by executing a set of instructions stored in the memory 130 by the set of processing units 124. The first inline compression produces a first set of compressed data 134C1 and is performed without storing the first set of data 134U1 in the data object 170 prior to compression.

At 530, a second inline compression is performed of a second set of the data 134U2 using hardware compression (via component 140*b*). The hardware compression is carried out by compression hardware 126 running in the data storage system 116. The second inline compression produces a second set of compressed data 134C2 and is performed without storing the second set of data 134U2 in the data object 170 prior to compression.

At 540, the first set of compressed data 134C1 are stored in the data object 170, and, at 550, the second set of compressed data 134C2 are stored in the data object 170.

As described above, an improved technique applies both inline software compression (via component 140*a*) and inline hardware compression (via component 140*b*) in a data storage system 116, using both types of compression together. The data storage system 116 applies inline software compression for compressing a first set of newly arriving data (e.g., 134U1) and applies inline hardware compression for compressing a second set of newly arriving data (e.g., 134U2). Both sets of data are directed to a data object 170, and the data storage system 116 compresses both sets of data without first storing uncompressed versions thereof in the data object 170.

Having described certain embodiments, numerous alternative embodiments or variations can be made. For example, although it has been described that the data object 170 is implemented as a file 404 in an internal file system 400, this is merely an example, as the data object 170 may be implemented in any suitable way.

Also, although certain metadata structures are particularly shown, such as leaf IB 410 and segment VBM 440, these are merely examples. Alternatively, other metadata structures may be employed for accomplishing similar results.

Further, although features are shown and described with reference to particular embodiments hereof, such features may be included and hereby are included in any of the disclosed embodiments and their variants. Thus, it is understood that features disclosed in connection with any embodiment are included as variants of any other embodiment.

Further still, the improvement or portions thereof may be embodied as a computer program product including one or more non-transient, computer-readable storage media, such as a magnetic disk, magnetic tape, compact disk, DVD, optical disk, flash drive, SD (Secure Digital) chip or device, Application Specific Integrated Circuit (ASIC), Field Programmable Gate Array (FPGA), and/or the like (shown by way of example as medium 560 in FIG. 5). Any number of computer-readable media may be used. The media may be encoded with instructions which, when executed on one or more computers or other processors, perform the process or processes described herein. Such media may be considered articles of manufacture or machines, and may be transportable from one machine to another.

As used throughout this document, the words "comprising," "including," "containing," and "having" are intended to set forth certain items, steps, elements, or aspects of something in an open-ended fashion. Also, as used herein and unless a specific statement is made to the contrary, the word "set" means one or more of something. This is the case regardless of whether the phrase "set of" is followed by a singular or plural object and regardless of whether it is conjugated with a singular or plural verb. Further, although ordinal expressions, such as "first," "second," "third," and so on, may be used as adjectives herein, such ordinal expressions are used for identification purposes and, unless specifically indicated, are not intended to imply any ordering or sequence. Thus, for example, a second event may take place before or after a first event, or even if no first event ever occurs. In addition, an identification herein of a particular element, feature, or act as being a "first" such element, feature, or act should not be construed as requiring that there must also be a "second" or other such element, feature or act. Rather, the "first" item may be the only one. Although certain embodiments are disclosed herein, it is understood that these are provided by way of example only and that the invention is not limited to these particular embodiments.

Those skilled in the art will therefore understand that various changes in form and detail may be made to the embodiments disclosed herein without departing from the scope of the invention.

What is claimed is:

1. A method of managing data storage, the method comprising:
    receiving multiple requests to write data to a data object stored in a data storage system, the data storage system including a set of processing units and memory;
    performing a first inline compression of a first set of the data using software compression, the software compression carried out by executing a set of instructions stored in the memory by the set of processing units, the first inline compression producing a first set of compressed data and performed without storing the first set of data in the data object prior to compression;
    performing a second inline compression of a second set of the data using hardware compression, the hardware compression carried out by compression hardware running in the data storage system, the second inline compression producing a second set of compressed data and performed without storing the second set of data in the data object prior to compression;
    storing the first set of compressed data in the data object; and
    storing the second set of compressed data in the data object.

2. The method of claim 1, further comprising operating a compression policy in the data storage system, the compression policy configured to select between software compression and hardware compression for compressing newly arriving data, based on a set of operating conditions in the data storage system.

3. The method of claim 2, wherein the compression policy is initially configured to direct a first share of newly arriving data writes to software compression and to direct a second share of newly arriving data writes to hardware compression, the first share and the second share initially being predetermined.

4. The method of claim 3, wherein the compression policy is further configured to vary at least one of the first share and the second share over time as the set of operating conditions in the data storage system changes.

5. The method of claim 4, further comprising monitoring a number of threads that are performing inline compression on the set of processing units, wherein the set of operating conditions includes the monitored number of threads.

6. The method of claim 5, wherein the compression policy is further configured to increase the second share of newly arriving data writes directed to hardware compression in response to an increase in the monitored number of threads that are performing inline compression.

7. The method of claim 5, further comprising monitoring a utilization level of the compression hardware that perform inline compression, wherein the set of operating conditions further includes the monitored utilization level of the compression hardware.

8. The method of claim 7, wherein the compression policy is further configured to decrease the second share of newly arriving data writes directed to hardware compression in response to an increase in the monitored utilization level.

9. The method of claim 5, wherein the data storage system further includes a cache configured to receive data specified in newly arriving data writes, and wherein compression policy is further configured to increase the second share of newly arriving data writes in response to the cache becoming full.

10. The method of claim 5, further comprising decompressing at least some of the second set of compressed data, which was compressed by hardware compression, using software decompression.

11. The method of claim 10, further comprising operating a decompression policy in the data storage system, the decompression policy configured to respond to requests for data reads by selecting between software decompression and hardware decompression based on the set of operating conditions in the data storage system.

12. The method of claim 5,
wherein storing the first set of compressed data includes storing a first header with the first set of compressed data, the first header indicating a first compression method used to compress the first set of compressed data, and
wherein storing the second set of compressed data includes storing a second header with the second set of compressed data, the second header indicating a second compression method used to compress the second set of compressed data.

13. The method of claim 12, further comprising:
decompressing the first set of compressed data by (i) reading the first header, (ii) selecting a first decompression method based on the first compression method indicated in the first header, and (iii) applying the selected first decompression method to decompress the first set of compressed data; and
decompressing the second set of compressed data by (i) reading the second header, (ii) selecting a second decompression method based on the second compression method indicated in the second header, and (iii) applying the selected second decompression method to decompress the second set of compressed data.

14. The method of claim 5, wherein the data storage system stores data in multiple storage extents, and wherein the method further includes:
monitoring a data temperature of each of first and second storage extents, the data temperature of each of the first and second storage extents indicating a respective level of read and/or write activity on that storage extent;
in response to the first storage extent having a relatively high data temperature, selecting, by the compression policy, a compression method that produces a lower compression ratio when compressing data directed to the first storage extent; and
in response to the second storage extent having a relatively low data temperature, selecting, by the compression policy, a compression method that produces a higher compression ratio when compressing data directed to the second storage extent.

15. A data storage system, comprising control circuitry that includes a set of processing units coupled to memory, the control circuitry constructed and arranged to:
receive multiple requests to write data to a data object stored in a data storage system, the data storage system including a set of processing units and memory;
perform a first inline compression of a first set of the data using software compression, the software compression carried out by executing a set of instructions stored in the memory by the set of processing units, the first inline compression producing a first set of compressed data and performed without storing the first set of data in the data object prior to compression;
perform a second inline compression of a second set of the data using hardware compression, the hardware compression carried out by compression hardware running in the data storage system, the second inline compression producing a second set of compressed data and performed without storing the second set of data in the data object prior to compression;
store the first set of compressed data in the data object; and
store the second set of compressed data in the data object.

16. A computer program product including a set of non-transitory, computer-readable media having instructions which, when executed by control circuitry of a data storage system, cause the control circuitry to perform a method of managing storage space in a file system, the method comprising:
receiving multiple requests to write data to a data object stored in a data storage system, the data storage system including a set of processing units and memory;
performing a first inline compression of a first set of the data using software compression, the software compression carried out by executing a set of instructions stored in the memory by the set of processing units, the first inline compression producing a first set of compressed data and performed without storing the first set of data in the data object prior to compression;
performing a second inline compression of a second set of the data using hardware compression, the hardware compression carried out by compression hardware running in the data storage system, the second inline compression producing a second set of compressed data and performed without storing the second set of data in the data object prior to compression;
storing the first set of compressed data in the data object; and
storing the second set of compressed data in the data object.

17. The computer program product of claim 16, wherein the method further comprises operating a compression policy in the data storage system, the compression policy configured to select between software compression and hardware compression for compressing newly arriving data, based on a set of operating conditions in the data storage system.

18. The computer program product of claim 17,
wherein the compression policy is initially configured to direct a first share of newly arriving data writes to software compression and to direct a second share of newly arriving data writes to hardware compression, the first share and the second share initially being predetermined, and wherein the compression policy is further configured to vary at least one of the first share and the second share over time as the set of operating conditions in the data storage system changes.

19. The computer program product of claim 17,
wherein storing the first set of compressed data includes storing a first header with the first set of compressed data, the first header indicating a first compression method used to compress the first set of compressed data, and
wherein storing the second set of compressed data includes storing a second header with the second set of compressed data, the second header indicating a second compression method used to compress the second set of compressed data.

20. The computer program product of claim 19, wherein the method further comprises:
decompressing the first set of compressed data by (i) reading the first header, (ii) selecting a first decompression method based on the first compression method indicated in the first header, and (iii) applying the selected first decompression method to decompress the first set of compressed data; and
decompressing the second set of compressed data by (i) reading the second header, (ii) selecting a second decompression method based on the second compression method indicated in the second header, and (iii) applying the selected second decompression method to decompress the second set of compressed data.

21. The method of claim 1, wherein the compression hardware includes dedicated hardware does not perform general-purpose computing but rather is focused on compression and decompression of data.

22. The method of claim 21, wherein the compression hardware takes the form of a separate circuit board, provided as one of (i) a daughterboard on a storage processor or (ii) an independent assembly that connects to the storage processor over one of (a) a backplane, (b) midplane, or (c) a set of cables.

* * * * *